United States Patent [19]
Albin et al.

[11] Patent Number: 5,533,194
[45] Date of Patent: Jul. 2, 1996

[54] HARDWARE-ASSISTED HIGH SPEED MEMORY TEST APPARATUS AND METHOD

[75] Inventors: Donald J. Albin, Tucson, Ariz.; Andrew D. Walls, San Jose, Calif.; Adalberto G. Yanes, Sunnyvale, Calif.; Kevin G. Zitny, Tucson, Ariz.

[73] Assignee: International Business Machines Corporation, Armonk, N.Y.

[21] Appl. No.: 364,689

[22] Filed: Dec. 28, 1994

[51] Int. Cl.⁶ .................................................. G11C 29/00
[52] U.S. Cl. ............................ 395/183.18; 395/182.05; 365/201
[58] Field of Search ........................ 395/182.05, 183.18, 395/182.05; 371/21.2, 21.3; 365/201

[56] References Cited

U.S. PATENT DOCUMENTS

| | | | |
|---|---|---|---|
| Re. 34,718 | 9/1994 | Tobita ............................... | 371/21.2 X |
| 4,342,084 | 7/1982 | Sager et al. ........................ | 364/200 |
| 4,379,259 | 4/1983 | Varadi et al. ....................... | 324/73 |
| 4,541,090 | 9/1985 | Shiragasawa ..................... | 371/21 |
| 4,584,682 | 4/1986 | Shah .................................. | 371/10 |
| 4,622,668 | 11/1986 | Dancker et al. ................... | 371/20 |
| 4,744,061 | 5/1988 | Takemae ............................ | 365/201 |
| 4,752,929 | 6/1988 | Kantz ................................ | 371/21 |
| 4,773,071 | 9/1988 | Nielsen ............................. | 371/25 |
| 4,873,705 | 10/1989 | Johnson ............................ | 371/21.2 |
| 4,942,576 | 7/1990 | Busack et al. .................... | 371/21.2 |
| 4,969,148 | 11/1990 | Nadeau-Dostie et al. ........ | 371/21.1 |
| 5,073,891 | 12/1991 | Patel .................................. | 371/21.3 |
| 5,075,892 | 12/1991 | Choy ................................ | 371/21.2 |
| 5,274,648 | 12/1993 | Eikill et al. ...................... | 371/21.2 |
| 5,373,509 | 12/1994 | Katsura ............................. | 371/21.2 |
| 5,377,148 | 12/1994 | Rajsuman ......................... | 371/21.2 X |
| 5,400,342 | 3/1995 | Matsumura ....................... | 371/21.2 |

OTHER PUBLICATIONS

"Present State and Trends in Test–Aids and Self–Testing for Very Large Scale integrated memory circuits" (In Nachr.tech. Elektron, East Germany); vol. 40, No. 1, Abstract, 1990, 1 reference Weisse, S.

"Computer aided repairs to memory circuits" (In Nachr. tech. Elektron. (East Germany) ); Steinfuhrer, H.; Kostner, R.; Nachr.tech. Elektron. (East Germany), vol. 37, No. 10, Abstract 1987, 17 ref.

"The Dilemma of Testing DRAM Boards"; David Ruedy and Tony Kakani; 3 pages; Electronic Test.

(List continued on next page.)

Primary Examiner—Robert W. Beausoliel, Jr.
Assistant Examiner—Glenn Snyder
Attorney, Agent, or Firm—Ohlandt, Greeley, Ruggiero & Perle

[57] ABSTRACT

A board-mounted memory array includes a plurality of memory modules, each module N bits wide by M bits long, the memory array including YM addresses of words that are XN bits long, where X and Y are integers. Each word is comprised of N bits from a common address value in each of X modules. The memory array includes memory interface logic mounted on the board which accesses the memory array in response to address signals. The memory interface logic is configured to use a first address procedure to access individually addressed words in the memory array at a first rate and, upon command, to use a second address procedure to sequentially access a span of contiguous addresses at a second, higher rate. A controller is coupled to the memory interface logic and enables application of address signals generated external to the board. Hardware test circuitry is resident on the board and controls the memory interface logic to implement the second address procedure and to apply test signals to a plurality of contiguous addresses in the memory array in accordance with a test protocol and to analyze output signals fed to the memory interface logic from the addressed memory words. The hardware test circuitry implements a protocol which causes application to the plurality of contiguous addresses of plural N bit test groups, each address receiving identical N-bit test groups across all bit positions in an addressed word.

8 Claims, 4 Drawing Sheets

OTHER PUBLICATIONS

"Chip Level Test Improvements Using CrossCheck Gate-Array Devices;" Mike Fertsch, Raytheon Microelectronics Center, Andover MA 01810; 5 pages; Electro /92; Conferemce Record, Hynes Convention Center, Boston, MA, May 12–14–1992.

"Design and Application of Semiconductor Memory Test Hardware"; Arthur A. Shaw, GTE Automatic Electric Laboratories; Apr. 1976; pp. 65–66 and 69–79.

"A Novel Built–In Self–Repair Approach to VLSI Memory Yield Enhancement"; P. Mazumder and J. S. Yih; Department of Electrical Engineering and Computer Science, The University of Michigan, Ann Abor, MI 48109; 9 pages; 1990 International Text Conference.

Hardware Algorithm For Static and Dynamic Rams Testing, Mofreh M. Salem, Aidao A. El–Gwad; Computers and Control Dept. Faculty of engineering EL–Mansoura University, El–Mansoura, Egypt; Modelling, Stimulation & Control, A. AMSE Press, vol. 40, No. 1, 1991, pp. 57–63.

"Design Aids and Hardware Testing of Microprocessor System Circuit Packs"; J. Grason, Bell Telephone Laboratories, Inc. Holmdel, NJ 07733; IEEE Proc. on Symposium on Design Automation and microprocessor, Feb. 24, 19977; pp. 95–99.

HARDWARE-ASSISTED HIGH SPEED MEMORY TEST APPARATUS AND METHOD

FIELD OF THE INVENTION

This invention relates to testing of large memory arrays and, more particularly, to a hardware-based test system which employs contiguous memory addressing protocols to enable a substantial increase in memory test speed.

BACKGROUND OF THE INVENTION

Dynamic random access memory chips (DRAMs) are the most commonly used memory components. A DRAM exhibits a regular but complex structure and consists of millions of transistors and storage capacitors that enable a wide variety of memory module errors. Those types can be grouped into four categories:

1. Stuck-at faults which occur when the logical value of a memory cell is always 0 or 1 and can't be changed.
2. Transition faults which prevent a cell from undergoing a 1 to 0 or 0 to 1 transition.
3. Coupling faults which occur when a transition in one cell changes the memory value in another cell.
4. Address decoder faults which access multiple cells with one address, never access some addresses, or address one cell with multiple addresses.

Many systems have been developed to test for various memory cell fault conditions. U.S. Pat. No. 5,274,648 to Eikill et al. describes a memory card which includes resident registers for retaining a data pattern stored to a memory array on the card; for storing a value read out from a memory position for comparison purposes, and logic circuitry for performing the comparison. Error indications are provided to a processor in the event that the register contents are not the same.

U.S. Pat. No. 4,342,084 to Sager et al. provides a method for performing tests on memory modules which enables a set of modules to be "fenced" while the remainder of the system operates with "unfenced" modules. The memory modules within the fenced area are then subjected to a test protocol which increments line addresses, while sequentially comparing true and complement patterns. U.S. Pat. No. 4,262,668 to Dancker et al. describes apparatus for testing a card mounted microprocessor/DRAM circuit. The Dancker et al. system employs two different clock generators, one of which makes the DRAM appear to the tester as a static memory device.

The following U.S. Pat. Nos. provide further descriptions of test circuits and techniques for memory modules: 4,969,148 to Nadeau-Dostie et al.; 4,379,259 to Varadi et al; 4,942,576 to Busack et al.; and 5,073,891 to Patel. The following references are of a more general nature and describe various techniques and systems for testing of semiconductor memories: "Design and Application of Semiconductor Memory Test Hardware", Shaw, GTE Automatic Electric Technical Journal, April, 1976, pages 65–79; "Design Aids and Hardware Testing of Microprocessor System Circuit Packs", Grason IEEE Proc. of Symposium on Design Automation & Microprocessor, Feb. 24, 1997, pages 95–99; "A Novel Built-In Self-Repair Approach to VLSI Memory Yield Enhancement", Mazumder et al., 1990 International Test Conference, paper 36.3, pages 833–841; "Chip Level Test Improvements Using Cross Check Gate-Array Devices", Fertsch, Electro-92 Conference Record, pages 266–270 (1992); and "Hardware Algorithm for Static and Dynamic RAMs Testing" Salem et al., Modeling, Simulation and Control, A, AMSE Press, Vol. 40, No. 1, 1991, pages 57–63.

Various algorithms have been derived to enable functional testing of DRAM modules. Those algorithms write specific patterns to a DRAM array and then check the read data for accuracy. In general, the test times of the algorithms increase with the size of the memory, linearly at best and as the square of the number of accesses to the memory chip at worst. Ruedy et al. describe an application of the "March" algorithm. That algorithm writes different values, sequentially, to individual bit positions in a memory and tests the output values to assure functionality of each bit position. The March algorithm detects faults by performing multiple reads and writes of patterns. In order to insure that the memory is defect free, the March algorithm pattern must be run against every bit position in the array. Performing this task using software requires an extended period of time because of the requirement to set hardware pointers/registers and to implement received commands. More specifically, the processor must write the pattern, read the pattern and compare it to the original pattern. Thus, if a processor takes three clock cycles per instruction, it takes three cycles to write the pattern, three cycles to read the pattern, and three cycles to compare the read data with the pattern in order to provide error indications. Thus, a total of nine processor cycles is required which must then be multiplied by the number of bit positions to arrive at the total number of cycle times required for the memory test. For large DRAM arrays, the required time becomes so long as to make the March algorithm unusable.

Accordingly, it is an object of this invention to provide an improved memory test procedure and system which reduces the amount of time required to test a large memory array.

It is another object of this invention to provide an improved memory test system and procedure which takes advantage of alternative addressing procedures that are available for commercially available memory modules.

It is still another object of this invention to provide an improved memory test system which automatically enables insertion of spare memory modules upon a finding of an uncorrectable error in a primary memory module.

SUMMARY OF THE INVENTION

A board-mounted memory array includes a plurality of memory modules, each module N bits wide by M bits long, the memory array including YM addresses of words that are XN bits long, where X and Y are integers. Each word is comprised of N bits from a common address value in each of X modules. The memory array includes memory interface logic mounted on the board which accesses the memory array in response to address signals. The memory interface logic is configured to use a first address procedure to access individually addressed words in the memory array at a first rate and, upon command, to use a second address procedure to sequentially access a span of contiguous addresses at a second, higher rate. A controller is coupled to the memory interface logic and enables application of address signals generated external to the board. Hardware test circuitry is resident on the board and controls the memory interface logic to implement the second address procedure and to apply test signals to a plurality of contiguous addresses in the memory array in accordance with a test protocol and to analyze output signals fed to the memory interface logic from the addressed memory words. The hardware test circuitry implements a protocol which causes application to the plurality of contiguous addresses of plural N bit test groups, each address receiving identical N-bit test groups across all bit positions in an addressed word.

DETAILED DESCRIPTION OF THE INVENTION

Figure 1:
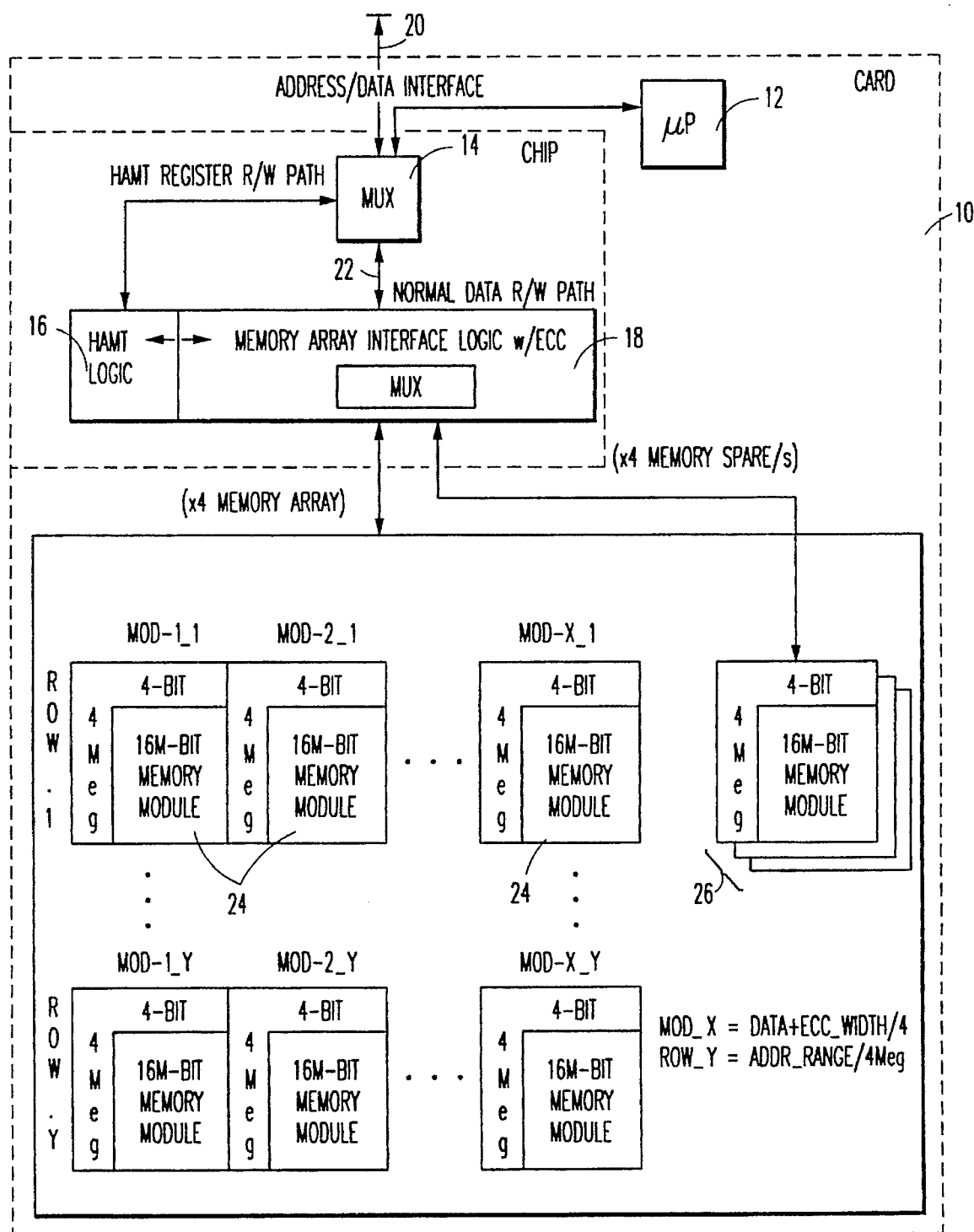
FIG. 1 is a block diagram of a DRAM memory array with circuitry that implements the invention hereof.

Referring to FIG. 1, a memory card 10 includes a resident microprocessor 12 that acts as a controller for memory operations on card 10. A multiplexer 14 provides a connection to either a hardware-assisted memory test (HAMT) logic circuit 16 or to a memory array interface logic circuit 18. Multiplexer 14 receive address data and other commands from either microprocessor 12 or, via an input/output line 20, from a processor that is external to card 10.

HAMT logic circuit 16 provides resident registers and sequence logic to enable application of test patterns, via memory array interface logic circuit 18, to the memory modules mounted on card 10. HAMT logic circuit 16 is enabled when microprocessor 12 passes a test command via multiplexer 14 to HAMT logic circuit 16. Under normal memory operating conditions, multiplexer 14 connects incoming data via a normal data read/write path 22 to memory interface logic circuit 18 which, in turn, performs the necessary memory accesses in response.

A plurality of memory modules 24 are mounted on card 10 and are arranged in rows and columns (not necessarily physically but electrically) as shown in FIG. 1. Each memory module 24 (in the exemplary embodiment shown in FIG. 1) is a 16 megabit, Synchronous DRAM (SDRAM) that is four bits wide and four megabits deep. Thus, each memory module 24 includes four million, four bit words. To configure a longer word structure, memory modules 24 are electrically connected so that common address, four bit words are concatenated to create a word that is a multiple of four bits long. In a preferred embodiment, a word length is 32 bits long, followed by an eight bit error checking character (ECC). Such a word/ECC structure is configured by ten memory modules connected in a "row". Successive rows of memory modules 24 enable the addition of further word addresses in four megabyte increments. It will be understood by those skilled in the art that the specifically described memory modules, bit configurations, and word/ECC size are given for exemplary purposes and that other memory module structures, bit arrangements and word sizes are equally applicable to this invention.

Memory card 10 further includes a plurality of spare memory modules 26 that are selectively insertable into the memory array upon a determination that an uncorrectable error has occured. The sparing action is described below.

A preferred application for the memory array shown in the Figs. is for buffering of large amounts of data fed to and from disk drives. An SDRAM has an inherent advantage of being suitable for sequential address accesses, but is less efficient when employed for non-sequential random address accesses. An SDRAM can be accessed on a memory address by memory address basis by providing to memory array interface logic 18 individual addresses to be accessed. In response, each addressed value is accessed using a normal memory read/write operation that requires multiple clock cycles. An SDRAM, however, further includes an enhanced addressing procedure that enables a plurality of contiguous addresses to be accessed at the clock rate (which is approximately an order of magnitude faster than the memory cycle time). Other DRAM configurations also exhibit enhanced addressing techniques for contiguous addresses, but the speed advantages gained thereby are not as dramatic as for an SDRAM. The invention, is equally applicable to any memory which exhibits an enhanced memory addressing procedure for contiguous addresses. It is to be understood that during the test procedure to be hereafter described, that HAMT logic 16 generates signals that cause memory array interface logic to operate memory modules 24 through use of the enhanced addressing procedure. This enables a complete memory test to be accomplished at high speed.

To implement the test procedure of the invention, it is preferred that a modified March algorithm be employed that uses a four bit pattern that is matched to four bit wide memory modules 24. A binary test pattern "P" is used during the test procedure and is as follows: 0001; 0010; 0011; 0100; 0101; 0110; 0111 and 1000. A complementary test pattern $\overline{P}$ is also employed that is as follows: 1110; 1101; 1100; 1011; 1010; 1001; 1000 and 0111. While other test patterns may be used, patterns P and $\overline{P}$ are preferred.

During the course of the modified March algorithm, application of patterns P and $\overline{P}$ enable a determination of coupling faults in the memory array. However, in any block of memory to which patterns P and $\overline{P}$ are written and read, only approximately 50% of coupling faults within a block of addresses can be detected. However, coupling faults which exist between bits within a block of addresses and bits that are external to the block of addresses can be detected almost 100% of the time. Thus, the larger the data block size that is subjected to the individual steps of the modified March algorithm, the larger the number of coupling faults that will be undetectable.

The speed of the modified March algorithm is directly related to the number of contiguous addresses accessed during a sequence of clock cycles. It has been determined that a reasonable compromise between test speed and number of undetectable coupling faults dictates that approximately 8 addresses be sequenced at a time, followed by a next sequence of 8 addresses, etc.

Figure 2:
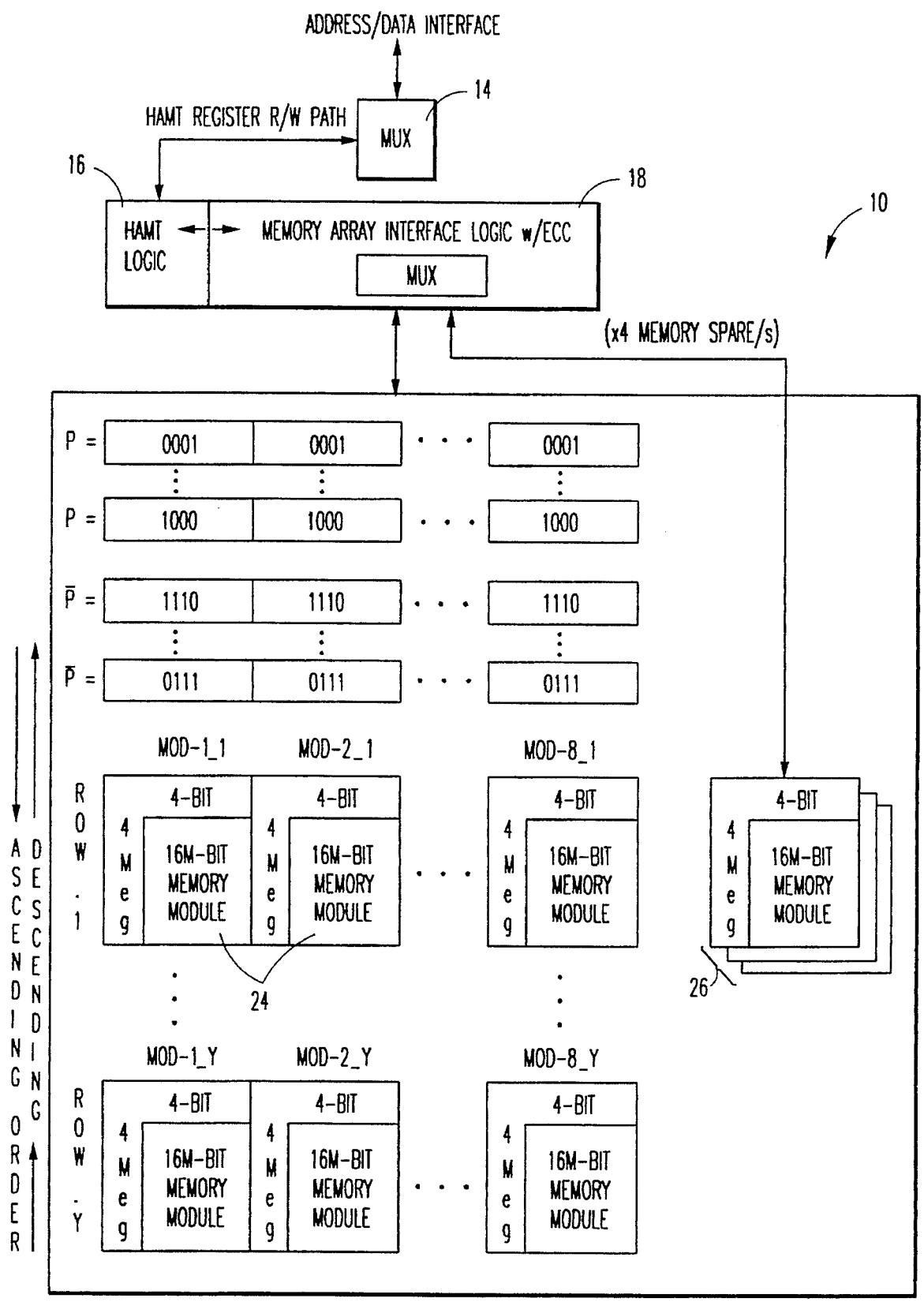
FIG. 2 is the block diagram of FIG. 1, further illustrating bit patterns that are employed in the testing of the memory modules shown therein.

Turning to FIG. 2, the implementation of the modified March algorithm will be described. The test procedure is implemented by HAMT logic circuit 16, in the manner of a state machine, wherein the applied pattern values are maintained in registers and are written, via memory array interface logic 18, into memory modules 24. Similarly, data that is read out of accessed memory modules 24 is fed via memory array interface logic 18 to HAMT logic circuit 16 for comparison with the written values. As indicated above, the procedure is applied to eight addresses at a time across all 40 bits of ten contiguous modules arranged in a row. The procedure is as follows:

a. Write 1's to all bit positions in eight sequential addresses of memory modules 24 (in descending address order). The write action continues in descending order of addresses (eight addresses at a time), and continues until the last address is written.

b. All memory positions in eight sequential addresses are now read, starting with the lowermost eight addresses. The read operation continues in ascending address order, eight addresses at a time. If a zero value is sensed, an error is indicated.

c. Zeroes are then written to all bit positions in eight contiguous addresses at a time (in descending address order) until the last address is written.

d. The lowermost eight addresses are first read to assure that all positions are zero. If not, an error is indicated. Next, three successive writes of P, $\overline{P}$, P are performed in the lowermost eight contiguous addresses. The procedure is repeated for the next higher sequence of eight contiguous addresses, etc. If any non-zero value is detected in a subsequent eight address data block as a result of the initial write :action, a coupling fault has resulted.

e. The uppermost eight addresses are then read and if other than the P pattern is detected a fault (coupling) is signaled. The read/compare action is followed by a write $\overline{P}$, write P, write $\overline{P}$ in the uppermost eight addresses. The procedure is repeated in descending address order in contiguous eight address memory blocks.

f. Lastly, the $\overline{P}$ pattern is read from the lowermost eight addresses to determine if a coupling fault has occurred, followed by a write of zeros into all addresses to reinitialize the memory. The procedure is repeated with respect to each eight address memory blocks in ascending address order.

Returning to FIG. 2, when pattern P is written to modules 24, address "0" has the initial value 0001 written into the four bits in each of the initial address positions in memory modules 24. At address 1, the next P value 0010 is written across the second address position in memory modules 24. At address 2, the value 0011 is written into each four bit position in each memory module 24, etc. In a similar fashion, when pattern $\overline{P}$ is written, identical four bit values are written into each memory position that resides at the same address.

Figure 3:
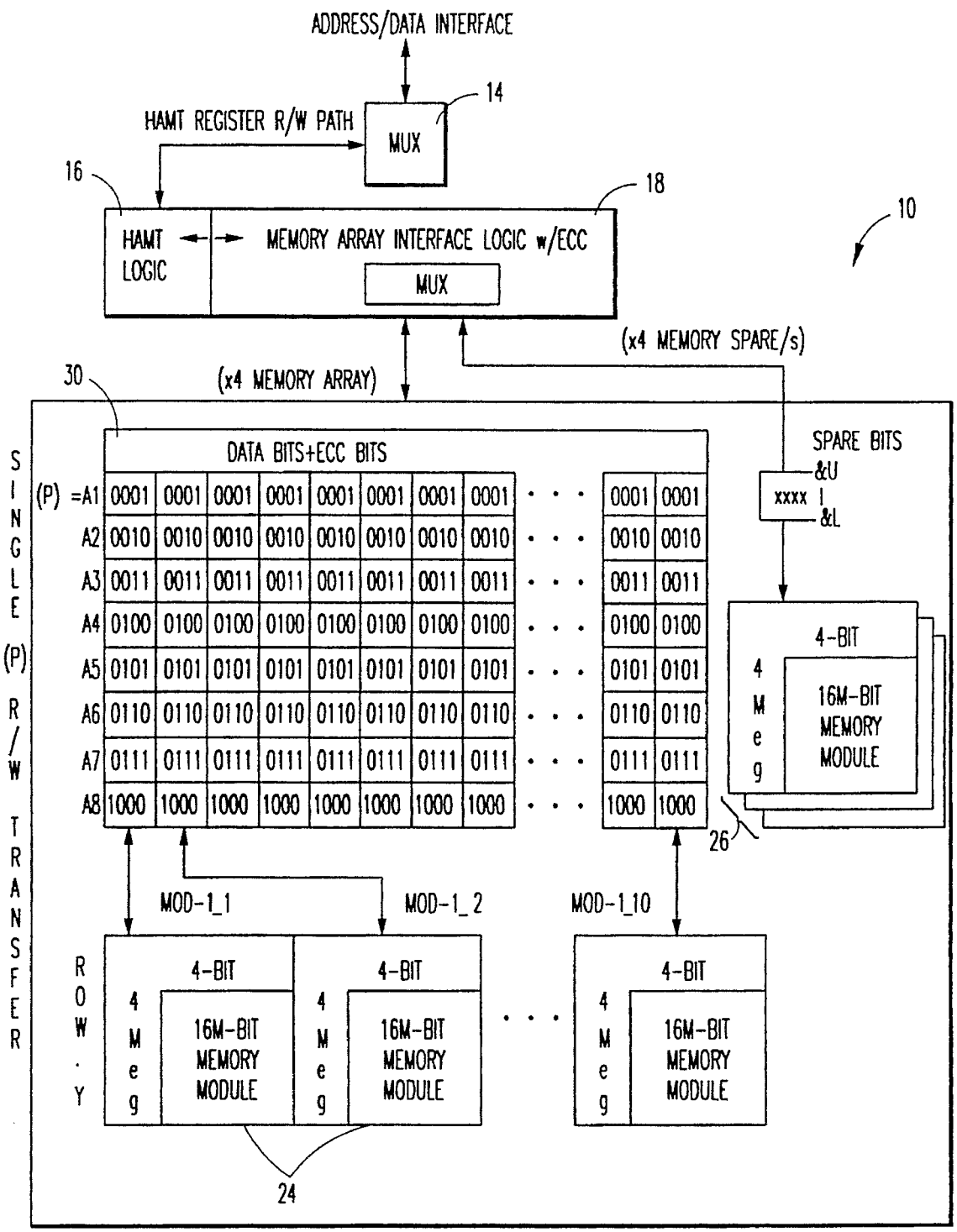
FIG. 3 illustrates a portion of the block diagram of FIG. 1 with a pattern of test bits that are applied to eight contiguous addresses.

In FIG. 3, the bit states in each of addresses A1–A8 is shown by chart 30. That pattern is repeated sequentially in each succeeding sequence of eight addresses down through memory modules 24.

Figure 4:
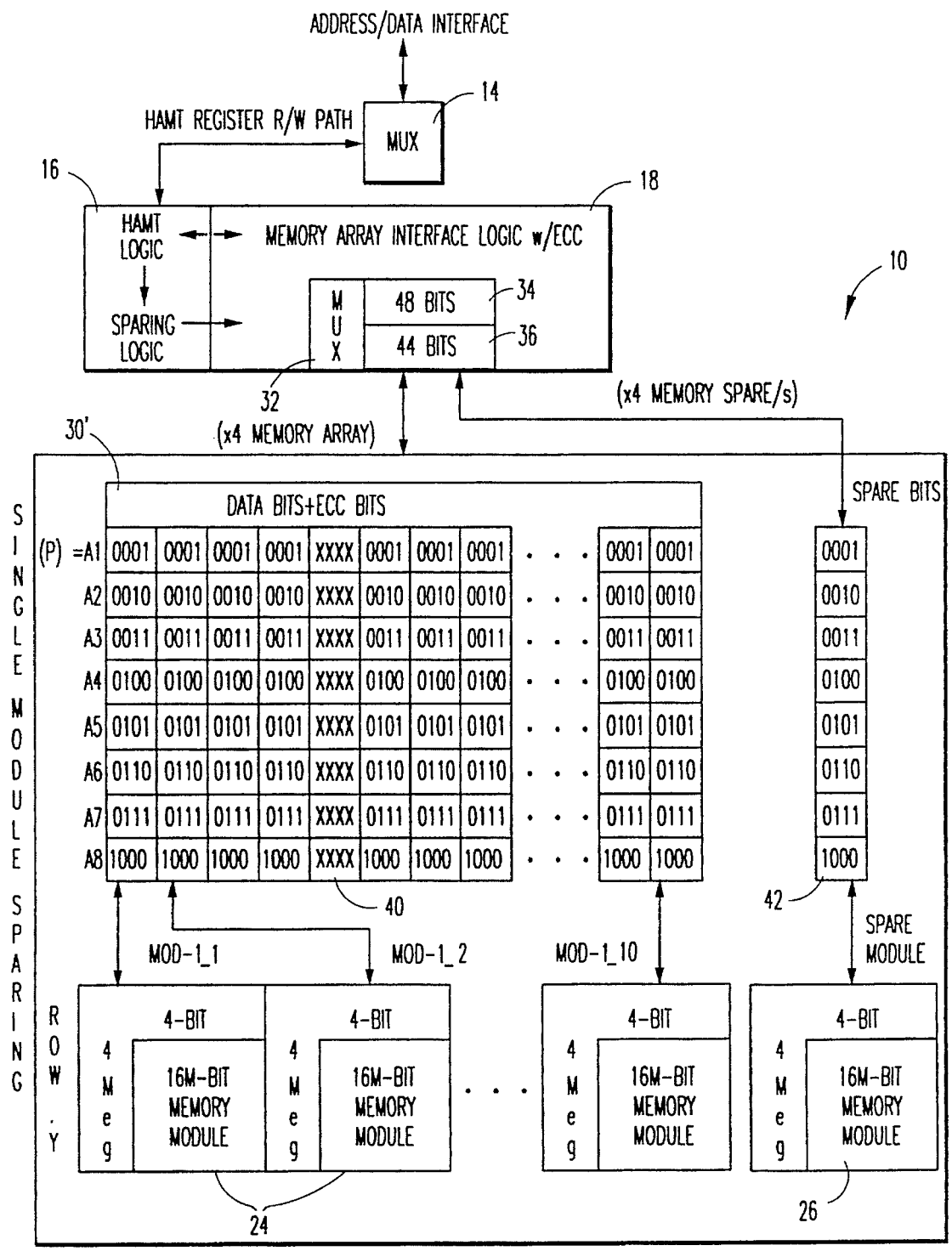
FIG. 4 is a modification of FIG. 3 showing how the test bit pattern is altered to enable testing of a spare memory module when a primary module requires replacement.

Turning to FIG. 4, the procedure will be described that is followed when an uncorrectable error is detected. HAMT logic circuit 16 includes "sparing logic" which keeps track of a number of spare memory modules 26 that are available and, further, which spare memory modules 26 have been substituted for memory modules 24. Memory array interface logic 18 includes a multiplexer 32 that enables switching of addresses and data among memory modules 24 and 26. A first register 34 is forty bits long and writes pattern 30 (see FIG. 4) via multiplexer 32 when no memory module 24 has been replaced by a memory module 26. By contrast, if a memory module 24 has been replaced by a memory module 26, a 44 bit register 36 is employed to enable spare memory module test bits to be applied, via multiplexer 32, to the replacement module 26.

Recall, that detection of an uncorrectable error will result in HAMT logic 16 causing replacement of an entire memory module 24 by a spare memory module 26. Since each spare memory module 26 is also four bits wide, the data written into the replaced memory module 24 (see column 40 in chart 30') is set to some arbitrary value (e.g., all zeros), and the P or $\overline{P}$ test bit patterns are written into the last four bits of register 36, as shown by chart column 42. In this manner, the memory test proceeds by applying the test protocol to the spare module 26 as the replacement memory module.

The module sparing action is performed as soon as a failure is detected. As HAMT logic 16 is configured with writable registers, by controlling microprocessor 12 appropriately, the sparing sequence and record keeping is adjustable to work with DRAMs and SDRAMs of various sizes and word lengths. Further, upon finding an uncorrectable error state, HAMT logic circuit 16 can set a flag which causes microprocessor 12 to report an error state to a controlling processor.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A test system for a board-mounted memory array, said memory array including a plurality of memory modules, each memory module N bits wide by M bits long, said memory array including YM addresses of words that are XN bits long, where X and Y are integers, each word comprised of N bits from a common address value in each of X memory modules, said test system further comprising:

memory interface logic means mounted on said board, for addressing said memory array in response to address signals, and configured to utilize a first addressing procedure to access addressed words at a first rate and, upon command, to utilize a second addressing procedure to address sequentially a span of words in contiguous addresses at a second rate that is faster than said first rate;

control means coupled to said memory interface logic means for enabling application of address signals thereto that are generated external to said board; and hardware test means coupled to said control means and memory interface logic means and mounted on said board, said hardware test means for controlling said memory interface logic means to implement said second addressing procedure and to apply, in accord with a test protocol, test signals to a plurality of contiguous addresses in said memory array and to analyze output signals fed to said memory interface logic means from said contiguous memory addresses so as to determine error states in said output signals, said test protocol causing a writing of N bit test groups to each N bit-wide bit group in a module that stores a portion of a word at an address, said hardware test means causing said memory interface logic means to implement said second addressing procedure by addressing said plurality of contiguous addresses at a rate of an applied clock signal, one address per clock signal, said hardware test means further applying said test signals to sequential blocks of contiguous addresses, each block of contiguous addresses comprised of a small subset of M to enable coupling faults between said blocks of contiguous addresses to be determined.

2. The test system as recited in claim 1 wherein said small subset is eight sequential addresses.

3. The test system as recited in claim 1 wherein identical N bit test groups are written in modules storing a part of a word.

4. The test system as recited in claim 1 wherein each said memory module is a synchronous dynamic random access memory.

5. The test system as recited in claim 1 wherein said board-mounted memory array comprises both an array of primary memory modules and a plurality of spare memory modules, said hardware test means responding to detection of an uncorrectable error from a primary memory module to cause connection of a spare memory module in place thereof, and subjecting said spare memory module to said second addressing procedure by said hardware test means through application of an N bit test group identically as would have been applied to said primary memory module for which said spare memory module is a replacement.

6. The test system as recited in claim 5 wherein said memory interface logic means includes address register means that is XN bits long for storing X, N bit test groups, said address register means including at least a further N bit portion for storing an additional N bit test group for a replacement module, said memory interface logic means controlled to output said additional N bit test group to a replacement memory module when said replacement memory module has been substituted for a primary memory module.

7. A method for testing a board-mounted memory array which includes a plurality of memory modules, each memory module N-bits wide by M-bits long, each word in said memory array comprised of plural groups of N-bits from a common address value in each of X modules, where N and X are integers, said method comprising the steps:

addressing sequentially a plurality of contiguous addresses in said memory array at a rate of one address per applied clock signal;

controlling said addressing to sequentially address small contiguous blocks of said addresses;

operating said addressing and controlling steps to perform the following test procedure;

1. writing all 1's to each word in said memory array;
2. reading values stored in all words in said memory array and indicating an error if a value other than 1 is detected;
3. writing all zeroes to each word in said memory array;
4. reading values stored in all words in a small contiguous block in said memory array and indicating an error if a value other than a 0 is detected;
5. for each word in said small contiguous block, writing a pattern P of N bit test groups thereacross, writing a pattern $\bar{P}$ thereacross, and writing said pattern P thereacross;
6. repeating steps 4 and 5 for succeeding small contiguous blocks until all small contiguous blocks have been subjected to steps 4 and 5;
7. for each word in a small contiguous block in said memory array, reading all bit values and indicating an error if other than said pattern P is detected, writing said pattern $\bar{P}$ thereinto, writing said pattern P thereinto, and writing $\bar{P}$ thereinto;
8. repeating step 7 for succeeding small contiguous blocks until all small contiguous blocks have been subjected to step 7;
9. reading values stored in all words in a small contiguous block in said memory array and indicating an error if other than said pattern $\bar{P}$ is detected; and
10. repeating step 9 for succeeding small contiguous blocks until all small contiguous blocks have been subjected to step 9.

8. The method as recited in claim 7 wherein a small contiguous block comprises 8 contiguous addresses.

* * * * *